United States Patent [19]

Ohmi et al.

[11] Patent Number: 4,795,582

[45] Date of Patent: Jan. 3, 1989

[54] SURFACE TREATING COMPOSITION FOR MICRO PROCESSING

[75] Inventors: Tadahiro Ohmi, Sendai; Nobuhiro Miki, Osaka; Hirohisa Kikuyama, Nara, all of Japan

[73] Assignee: Hashimoto Chemical Industries Co., Ltd., Osaka, Japan

[21] Appl. No.: 99,463

[22] Filed: Sep. 21, 1987

[30] Foreign Application Priority Data

Sep. 29, 1986 [JP] Japan .................. 61-230439

[51] Int. Cl.$^4$ ............................................ C09K 13/08
[52] U.S. Cl. .................. 252/79.3; 252/79.4; 156/662
[58] Field of Search .................. 252/79.4, 79.3; 156/662, 653, 657, 663

[56] References Cited

U.S. PATENT DOCUMENTS 4,040,897  8/1977  Blish, II et al. ............ 252/79.3 X Primary Examiner—David L. Lacey
Assistant Examiner—Thi Dang
Attorney, Agent, or Firm—Armstrong, Nikaido, Marmelstein & Kubovcik

[57] ABSTRACT

A surface treating composition for micro processing which comprises a mixture of hydrofluoric acid, ammonium fluoride solution and water, and at least one compound selected from the group of surfactants consisting of aliphatic carboxylic acids, salts of aliphatic carboxylic acids, aliphatic amines and aliphatic alcohols.

6 Claims, 1 Drawing Sheet

SURFACE TREATING COMPOSITION FOR MICRO PROCESSING

The present invention relates to surface treating compositions for micro processing, and more particularly to such a composition for use in microprocessing the surface of workpieces by wet etching for the fabrication of semiconductor devices.

In fabricating semiconductor devices, an oxide film formed on the surface of silicon is usually processed by wet etching. A mixture of hydrofluoric acid and ammonium fluoride solution, i.e. so-called buffered oxide etchants (hereinafter referred to as BOE), is used as an etching agent for this process. The ammonium fluoride present in the BOE serves to adjust the etching speed and also stabilizes the etching speed even when the concentration of the hydrofluoric acid varies.

With rapid advances in recent technologies, more sophisticated semiconductors have been developed. For example, as the component density of integrated circuit increases, the dimension of such devices has become ever smaller. Stated more specifically with reference to memories, 250 KD-RAM is 1.5 to 2 $\mu$m, and 1 MD-RAM is 1 to 1.3 $\mu$m in device dimension. 4MD-RAM is as small as 0.7 to 0.8 $\mu$m in device dimension.

On the other hand, the BOE is prepared usually from 50% hydrofluoric acid and 40% ammonium fluoride solution admixed therewith in an amount of at least 5 parts by weight per part by weight of the acid. The large proportion of the ammonium fluoride solution gives the BOE high surface tension of 80 to 95 dyne/cm at the typical etching temperature. This entails the problem that the silicon oxide film or resist film to be etched is not satisfactorily wettable with the BOE resulting in the drawback that when exquisite etching is required, the etching solution fails to fully penetrate into micro grooves formed by the resist film to create faults.

Further with an increase in the component density of integrated circuit, it is required that the particles present in the etching solution be reduced.

In view of the above situation, new etching agents are developed as disclosed in Unexamined Japanese Patent Publications Nos. 39176/1985 and 249332/1985. These agents are prepared by admixing a fluorine-containing carboxylic acid or fluorine-containing sulfonic acid, and/or a salt of the acid with a BOE. Nevertheless, these compounds have the drawback that the resulting solution exhibits increased surface tension when filtered or stored for a prolonged period of time.

Further the above-mentioned publication, although referring to a reduction achieved in the surface tension, mention nothing about the wettability of the surface to be etched with the agent, and no consideration is given to the wettability. Moreover, the above compounds to be admixed with the BOE all have the likelihood of remaining on the silicon substrate as strongly thereby adsorbed. These fluorine-containing compounds, if remaining on the substrate, are likely to adversely affect the properties of the device obtained or to give the substrate water repellency that could produce an adverse influence on the integrated circuit manufacture. Additionally, fluoro surfactants are expensive and are disadvantageous to use commercially.

An object of the present invention is to provide a BOE which will not exhibit higher surface tension when filtered or preserved for a prolonged period of time.

Another object of the invention is to provide a BOE which is excellent in wetting ability and capable of fully penetrating into micro grooves in the surface to be treated to ensure effective etching.

Another object of the invention is to provide a BOE having little or no likelihood that the components thereof will remain on silicon substrates by being adsorbed.

Another object of the invention is to provide a BOE which is inexpensive and well-suited to commercial use.

These objects of the present invention can be fulfilled by incorporating at least one compound selected from the group of surfactants consisting of aliphatic carboxylic acids, salts of aliphatic carboxylic acids, aliphatic amines and aliphatic alcohols into a mixture of hydrofluoric acid, ammonium fluoride solution and water.

Thus, the present invention provides a surface treating composition for micro processing which comprises a mixture of hydrofluoric acid, ammonium fluoride solution and water, and at least one compound incorporated in the mixture and selected from the group of surfactants consisting of aliphatic carboxylic acids, salts of aliphatic carboxylic acids, aliphatic amines and aliphatic alcohols.

These objects and other features of the invention will become apparent from the following description.

While conducting continued research to overcome the drawbacks of the above surface treating agents, we conceived the novel idea that the drawbacks might be obviated by admixing hydrocarbon surfactants with the agents. Based on this idea, we have carried out further research, conducting many experimental investigations to find what hydrocarbon surfactants have good solubility, retain their properties for a prolonged period of time without segregating from the agent and will not permit the agent to exhibit increased surface tension on filtration. Consequently, we have found that when at least one compound selected from the group of specific surfactants consisting of aliphatic carboxylic acids, salts of aliphatic carboxylic acids, aliphatic amines and aliphatic alcohols is admixed with a BOE, the resulting surface treating composition shows reduced surface tension and enhanced ability to wet the surface to be etched (which means the surface of silicon substrate, silicon oxide film, resist film or the like to be microprocessed) because the contact angle of the composition on the surface is small, and does not permit the segregation of the surfactant. We have also found that these additives do not permit the surface treating composition to exhibit increased surface tension even when the composition is filtered, further acting to decrease the amount of fine particles in the BOE. Thus, the present invention has been accomplished.

The micro processing surface treating composition of the present invention consists essentially of a mixture of hydrofluoric acid, ammonium fluoride solution and water, and at least one of the above-mentioned four kinds of specific surfactants incorporated in the mixture.

The aliphatic carboxylic acids, one kind of surfactants for use in the invention, are compounds represented by the formula $C_nH_{2n+1}COOH$ (wherein n is an integer of from 5 to 11). When the number of carbon atoms is outside the above range, there is a tendency toward higher surface tension. Examples of such carboxylic acids are $C_5H_{11}COOH$, $C_6H_{13}COOH$, $C_7H_{15}COOH$, $C_8H_{17}COOH$, $C_9H_{19}COOH$, $C_{10}H_{21}COOH$ and $C_{11}H_{23}COOH$.

The salts of aliphatic carboxylic acids are represented by the formula $C_nH_{2n+1}COONH_3R$ (wherein n is an integer of from 5 to 11, and R is hydrogen or alkyl having 5 to 12 carbon atoms). When the number of carbon atoms is outside the above range, higher surface tension will result. Examples of such salts are $C_5H_{11}COONH_4$, $C_7H_{15}COONH_3(H_{15}C_7)$, $C_8H_{17}COONH_3(H_{17}C_8)$, $C_7H_{15}COONH_4$ and $C_8H_{17}COONH_4$.

The aliphatic amines are compounds represented by the formula $C_mH_{2m+1}NH_2$ (wherein m is an integer of from 7 to 12). When the number of carbon atoms is outside the above range, higher surface tension will result. Examples of such amines are $C_7H_{15}NH_2$, $C_8H_{17}NH_2$, $C_9H_{19}NH_2$, $C_{10}H_{21}NH_2$ and $C_{12}H_{25}NH_2$.

The aliphatic alcohols are compounds represented by the formula $C_nH_{n+1}OH$ (wherein n is an integer of from 6 to 12) Examples of such alcohols are $C_6H_{13}OH$, $C_7H_{15}OH$, $C_8H_{17}OH$, $C_9H_{19}OH$, $C_{10}H_{21}OH$ and $C_{12}H_{25}OH$.

These surfactants are used singly, or at least two of them are usable in admixture. The surfactant is used in the form of a solid or liquid in an amount of 10 to 10,000 ppm, preferably about 50 to about 1,000 ppm, based on the composition. If present in an amount of less than 10 ppm, the surfactant produces little or no effect, while use of more than 10,000 ppm will not produce a correspondingly increased effect. The BOE to which the surfactant is to be added can be prepared by any method. Typically, the mixture is prepared, for example, by introducing ammonia gas into hydrofluoric acid, or adding an ammonium fluoride solution to hydrofluoric acid. The mixture has a HF concentration of 0.1 to 10% by weight and an $NH_4F$ concentration of 15 to 40% by weight. For example, when 9 parts of 40% by weight of ammonium fluoride solution is admixed with 1 part of 50% hydrofluoric acid, the mixture obtained contains 5.0% by weight of HF and 36.0% by weight of $NH_4F$.

The micro processing surface treating composition of the invention contains at least one of the above-specified surfactants, which permits the composition to exhibit reduced surface tension and a smaller contact angle with the surface to be etched. The composition therefore has remarkably improved ability to wet the surface and uniformly penetrates into micro grooves to make the perfect performance. It is very important that the contact angle be small. While it is generally thought that lower surface tension results in improved wetting ability, the wetting ability is associated with both surface tension and contact angle. (The surface tension is interaction between a gas and a liquid at the interface, while the contact angle relates to interaction between a solid and a liquid at the interface.) When fluoro-surfactants are used as in the prior art, the surface tension can be reduced, but the contact angle with the surface to be etched is large, hence diminished wettability. We have conducted research also in this respect in detail and found surfactants which are capable of giving substantially improved wettability for use in the composition of the invention. According to the invention, such surfactants are incorporated in a mixture system to afford more widely varying compatibilities, foaming properties and wettabilities than when a single-component system is used to meet various conditions for micro processing. It is especially noteworthy that the presence of the specified surfactant does not permit the segregation of the surfactant even when the surface treating composition is filtered, allowing the composition to retain unchanged surface tension and to exhibit the desired etching activity without impairment. Although research has yet to be made to fully clarify why the specified surfactants only produce such an outstanding effect, the examples to be given later show that these specific surfactants reliably exhibit the excellent effect. In fact, we found that the surface treating composition of the invention remained unchanged in its properties even when passed through a 0.1 μm Teflon filter. Further surprisingly, we have found that the filtration of the composition decreases the particles (0.5 μm and larger) contained therein, although the reason still remains to be clarified in detail.

BRIEF DESCRIPTION OF THE DRAWING

FIG. 1 shows the surface as treated in the presence of the surfactant, and FIG. 2 shows the surface as treated in the absence of the surfactant.

While the present invention has been described above primarily with reference to the etching treatment of $SiO_2$ film using a resist mask, the invention is of course not limited to such application but is similarly useful for etching the entire surface of a wafer using no resist pattern. In this case, the following treatment is usually conducted. Using a silicon nitride film for masking, the wafer is subjected to selective oxidation to form an oxide film (field oxide film) having a large thickness (about 1 μm) for device separation. After the formation of the field oxide film, the silicon nitride film is removed by plasma etching in LOCOS step, and the $SiO_2$ film beneath the nitride film is thereafter etched away using a BOE to expose the silicon surface over the area where a device is to be formed. The conventional BOE, if used for this treatment, will not fully wet the very small area, failing to completely remove the film to result in faults. However, this problem can be overcome by using the surface treating composition of the invention.

The treating composition of the invention is also usable in the process which follows the treatment of gate polysilicon with RIE and in which the entire surface of the wafer is usually etched with the BOE to remove the gate oxide film from the source-drain region, whereby the faults due to etching irregularities can be completely eliminated.

The BOE is used for etching the entire surface of the silicon substrate to remove an oxide film from the contact portions in the reflow process which follows formation of contact holes in PSG with RIE. If the solution fails to fully flow into the small contact holes, some portions of the oxide film remain unremoved. The remaining portions will then prevent contact of Al wiring to greatly lower the yield of the product. This problem can also be overcome by using the composition of the invention.

Figure 1:
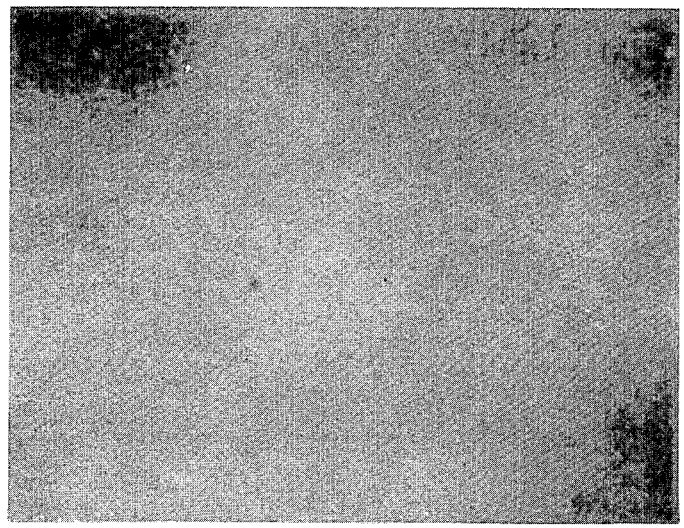
FIGS. 1 and 2 are electron photomicrographs (X50) showing silicon surfaces.
Figure 2:
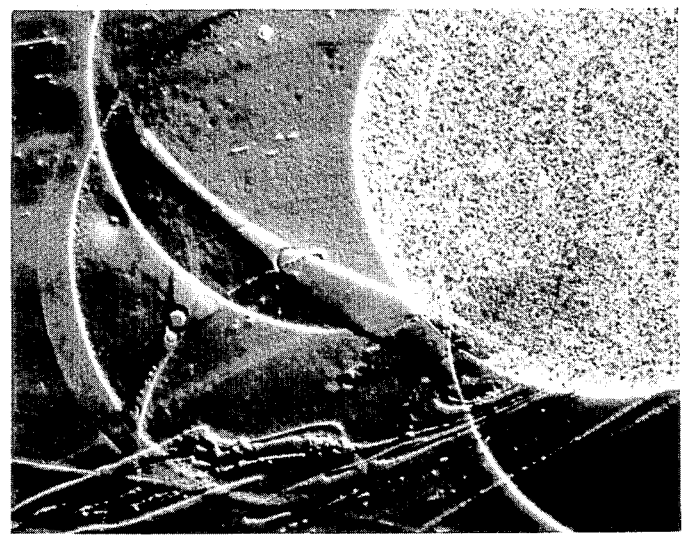

The surface treating composition of the invention achives a higher etching speed on the $SiO_2$ surface and a lower etching speed on the Si surface and therefore etches the oxide with greater selectivity than the BOE free from the specified surfactant. In contrast, the presence of the fluoro-surfactant achieves a lower etching speed on $SiO_2$ than when the surfactant is absent. Thus, the agent incorporating the latter surfactant has the drawback of being less oxide-selective in etching than the composition of the invention. For example, when silicon is immersed for a long period of time in a BOE containing 6% by weight of HF and 30% by weight of NH4F, the presence of the surfactant of the invention produces a marked difference in the state of the surface of silicon. With the surfactant of the invention present, the surface of the silicon is uniform and free of etching as seen in FIG. 1, whereas the solution, when free from the surfactant, unevenly etches the surface to produce irregularities as seen in FIG. 2. This shows that the treating composition of the invention is less likely to etch the silicon surface, thus substantiating the greater selectivity mentioned above.

As described above, the surface treating composition of the invention has great advantages in processing substrate surfaces with use of a resist pattern and also in etching the entire surface of substrates especially for the fabrication of VLSI having an micro pattern.

The surface treating composition of the present invention has improved wetting ability and is indispensable to micro etching with higher uniformity and with increased component density. The composition has the characteristics of remaining totally unchanged in its properties even when filtered or stored for a prolonged period of time, consequently assuring micro processing with a high degree of uniformity. Since the composition is diminished in the particles contained therein and has high ability to wet the surface to be etched, the composition has the advantage that the particles remaining on the etched surface can be reduced.

For a better understanding of the features of the present invention, various surfactants other than those of the invention were added to the BOE, and the resulting compositions were checked for surface tension before and after filtration, upon the addition and upon lapse of 30 days. The results are given in Table 1, in which the symbols represent the following surface tension values.

A: up to 30 dyne/cm
B: 30 to 40 dyne/cm (usable)
C: at least 40 dyne/cm

TABLE 1-(1)

|  | On addition | | After 30 days | |
| --- | --- | --- | --- | --- |
|  | Before filtration | After filtration | Before filtration | After filtration |
| Fluorine-containing surfactant | | | | |
| $C_7F_{15}COONH_4$ | A | C | | |
| Ammonium perfluoroalkylsulfonate A | A | A | B | C |
| Ammonium perfluoroalkylsulfonate B | A | A | C | |
| Perfluoroalkylbetaine | A | A | B | C |
| $RfCH_2CH_2O(CH_2CH_2O)_xH$ | C | | | |
| $C_8F_{17}SO_2N(C_2H_4O)_nH$<br>$\mid$<br>$R$ | A | C | | |
| Perfluoroalkyltrimethylammonium salt | B | C | | |
| Perfluoroalkylcarboxylic acid | A | C | | |
| $C_8F_{17}COOH$ | A | C | | |
| Perfluoroalkylpolyoxyethylene ethanol | B | C | | |
| Fluorinated alkyl ester | B | C | | |
| Perfluoroalkyl EO adduct A | B | C | | |
| Perfluoroalkyl EO adduct B | B | C | | |
| Ammonium perfluoroalkylcarboxylate A | A | C | | |
| Ammonium perfluoroalkylcarboxylate B | A | C | | |
| Ammonium perfluoroalkylcarboxylate C | C | | | |
| $C_8F_{17}NC_3H_7$<br>$\mid$<br>$CH_2COONH_4$ | A | C | | |
| $RfCH_2CH_2SCH_2CH_2N(CH_3)_3$<br>$\mid$<br>$CH_3SO_4$ | A | C | | |
| $RfN^+H_3I^-$ | A | C | | |
| $RfCH_2CH_2SCH_2CH_2CO_2NH_4$ | A | C | | |
| Hydrocarbon surfactant | | | | |
| Ammonium dodecylbenzenesulfonate | A | C | | |
| Soft ammonium alkylbenzenesulfonate | A | C | | |
| Alkyldiphenyl ether disulfonic acid salt | A | A | A | C |
| Ammonium dialkylsulfosuccinate | A | B | A | C |
| Polyethylene glycol monostearate | B | C | | |
| Ammonium polycarboxylate | C | | | |
| Polyoxyethylene oleic acid ester | A | A | A | C |
| Polyoxyethylene nonyl phenyl ether | B | C | | |
| Octadecylamine acetate | A | C | | |
| Stearylamine acetate | A | B | B | C |
| Dimethylalkyl (coconut) betaine | A | A | B | C |
| Polyoxyethylenealkylphenyl ether sulfate ammonium | A | A | A | C |
| Laurylsulfuric acid triethanolamine | A | A | A | C |
| $RCOO(CH_2CH_2O)_nH$ | A | C | | |
| $C_3H_7COOH$ | C | | | |
| $C_{13}H_{17}COOH$ | C | | | |
| $C_4H_9COOH$ | C | | | |
| Polyoxyethylene alkyl phenyl ether | B | C | | |
| Polyoxyethylene lanolin alcohol ether | A | C | | |
| Coconut amine acetate | A | B | B | C |

TABLE 1-(1)-continued

|  | On addition | | After 30 days | |
|---|---|---|---|---|
|  | Before filtration | After filtration | Before filtration | After filtration |
| Dodecyltrimethylammonium chloride | A | C | | |
| $C_{11}H_{23}CO(CH_2CH_2)_nH$ | B | | | |
| Polyoxyethylene higher alcohol | A | A | B | C |
| Monoglycerin ester | B | C | | |
| Polyoxyethylene alkyl ether | A | A | A | C |
| Polyoxyethylene lanolin acid ester | B | C | | |
| Lauryl alcohol | A | C | | |
| $C_5H_{11}NH_2$ | C | | | |
| $C_6H_{13}NH_2$ | C | | | |
| Tri-n-octylamine | C | | | |
| Polyoxyethylene lanolin fatty acid ester | B | C | | |

Examples are given below, in which the percentages are all by weight. The properties were determined by the following methods.

The surface tension was measured by the vertical plate method.

The contact angle was measured by the drop buildup method.

The number of particles was measured by liquidborne particle counter (HIAC/ROYCO 4100-346 CLS).

EXAMPLES 1 to 11

The surfactants listed in Table 2 were added to a BOE containing 6% of HF and 30% of $NH_4F$ to prepare surface treating compositions for micro processing. The compositions were allowed to stand at room temperature for preservation, sampled a specified period of time after the preparation and checked for surface tension.

TABLE 2

| | | Surface tension of treating compositions (dynes/cm) | | | |
|---|---|---|---|---|---|
| | | On addition | | After 30 days | |
| Ex. | Surfactant | Amount (ppm) | Before filtration | After filtration | Before filtration | After filtration |
| 1 | $C_7H_{15}COOH$ | 50 | 28.1 | 29.8 | 28.5 | 29.6 |
| | | 100 | 28.1 | 29.7 | 28.2 | 29.8 |
| | | 200 | 28.1 | 29.5 | 28.0 | 29.8 |
| | | 1000 | 28.3 | 28.5 | 28.4 | 29.1 |
| 2 | $C_7H_{15}COOH + C_8H_{17}NH_2$ | 50 | 27.0 | 26.7 | 27.6 | 29.0 |
| | | 100 | 27.6 | 27.5 | 23.5 | 24.4 |
| | | 200 | 22.5 | 23.1 | 22.7 | 23.5 |
| | | 1000 | 22.2 | 21.5 | 21.3 | 21.5 |
| 3 | $C_8H_{17}NH_2$ | 50 | 29.1 | 29.5 | 29.4 | 29.1 |
| | | 100 | 25.2 | 25.6 | 25.2 | 25.3 |
| | | 200 | 22.4 | 22.8 | 22.2 | 22.5 |
| | | 1000 | 21.9 | 22.0 | 21.5 | 21.2 |
| 4 | $C_8H_{17}NH_2 + C_8H_{17}OH$ | 200 | 27.7 | 27.8 | 27.5 | 28.3 |
| 5 | $C_5H_{11}COOH$ | 200 | 23.2 | 23.6 | 25.5 | 25.6 |
| 6 | $C_8H_{17}COOH$ | 200 | 27.6 | 27.8 | 28.4 | 29.9 |
| 7 | $C_{11}H_{23}COOH$ | 200 | 23.2 | 23.8 | 24.5 | 24.7 |
| 8 | $C_7H_{15}COONH_4$ | 200 | 27.4 | 27.6 | 28.5 | 29.2 |
| 9 | $C_8H_{17}COONH_4$ | 200 | 24.8 | 25.7 | 25.1 | 25.8 |
| 10 | $C_{12}H_{25}NH_2$ | 200 | 23.5 | 28.5 | 24.1 | 29.1 |
| 11 | $C_{12}H_{25}OH$ | 200 | 28.3 | 29.5 | 29.0 | 29.9 |

EXAMPLE 12

A BOE containing 5.0% of HF and 36.0% of $NH_4F$ was passed through a 0.1 μm Teflon filter. The number of particles contained in the solution reduced from 50-100 particles/ml to 20-30 particles/ml by the filtration. When octylamine, or a mixture of octylamine and capric acid was added in an amount of 200 ppm to the BOE, the surface tension decreased to 22.4 dyne/cm, and the filtration of the resulting composition greatly reduced the particles contained therein. When polyoxyethylene alkyl ether was added in an amount of 200 ppm to the solution, the surface tension decreased to 28.5 dyne/cm, but the filtration of the resulting composition failed to substantially reduce the particles contained therein.

TABLE 3

| Comparison of the counts of particles before and after filtration (particles/ml) | | |
|---|---|---|
| Surfactant | Before filtration | After filtration |
| None | 50-100 | 20-30 |
| $C_8H_{17}NH_2$ | 50-100 | Up to 1 |
| $C_8H_{17}NH_2 + C_7H_{15}COOH$ | 50-100 | Up to 1 |
| Polyoxyethylene alkyl ether | 50-100 | 30-50 |

EXAMPLE 13

A silicon substrate and another silicon substrate with an oxide film formed thereon were dipped in a BOE containing 6% of HF and 30% of $NH_4F$, with or without addition of a surfactant ($C_7H_{15}COOH + C_8H_{17}NH_2$) to the solution, and the particles remaining on the etched surfaces were counted. The BOE used contained 53 particles/ml.

TABLE 4

| Counts of particles adsorbed on the etched surfaces (within field of observation) | | |
|---|---|---|
| | No addition | Surfactant (200 ppm) |
| Oxide film | 244 | 26 |
| Silicon | 266 | 34 |

EXAMPLE 14

The surfactants listed below were added in an amount of 1,000 ppm to a BOE containing 5% of HF and 36.0% of $NH_4F$ to obtain compositions, which were checked for contact angle on various surfaces to be etched. Table 5 shows the results.

TABLE 5

| | Contact angle on surface to be etched | | | |
|---|---|---|---|---|
| Surfactant | Surface tension (dyne/cm) | Silicon (Si) (deg) | silicon oxide film (deg) | Resist (deg) |
| Blank | 86.0 | 82 | 20 | 69 |
| $C_8H_{17}NH_2$ | 22.9 | Up to 10 | Up to 10 | Up to 10 |
| $C_8H_{17}NH_2 + C_7H_{15}COOH$ | 25.2 | Up to 10 | Up to 10 | Up to 10 |
| $C_7F_{15}COONH_4$ | 18.5 | 88 | 15 | 64 |
| Perfluoroalkyl- | 22.1 | 84 | 15 | 64 |

TABLE 5-continued

| Surfactant | Contact angle on surface to be etched | | | |
|---|---|---|---|---|
| | Surface tension (dyne/cm) | Silicon (Si) (deg) | silicon oxide film (deg) | Resist (deg) |
| sulfonate | | | | |

Resist: treatment with OMR83

EXAMPLE 15

An $SiO_2$ film, 10,000 angstroms in thickness, was formed over the surface of a 3-cm square silicon substrate, a resist was applied to one-half of the film, the substrate was then immersed for a specified period of time in a BOE containing of a specified surfactant, 6% of HF and 30% of $NH_4F$, and the etching speed was measured by surface profiler. The speed of etching of silicon was similarly measured using a 3-cm square silicon substrate coated with a wax over one-half of its surface. Tables 6 to 8 show the results.

TABLE 6

| Surfactant | $SiO_2$ etching speed | | | |
|---|---|---|---|---|
| | Amount of etching (Å) Immersion time | | | Etching speed (Å/min) |
| | 3 min | 5 min | 7 min | |
| None | 2508 | 4211 | 6153 | 852.4 |
| $C_8H_{17}NH_2$ + $C_7H_{15}COOH$ | 2657 | 4296 | 5893 | 862.3 |
| Perfluoroalkyl-carboxylate | 1664 | 2628 | 3924 | 546.9 |

TABLE 7

| Surfactant | Si etching speed | | |
|---|---|---|---|
| | Amount of etching (Å) Immersion time | | Etching speed (Å/min) |
| | 72 hours | 92 hours | |
| None | 4968 | 6290 | 1.14 |
| $C_8H_{17}NH_2$ + $C_7H_{15}COOH$ | 1256 | 1940 | 0.32 |
| Perfluoroalkyl-carboxylate | 1382 | 1545 | 0.30 |

TABLE 8

| Surfactant | Etching selectivity ratio |
|---|---|
| | Selectivity ratio* |
| None | 748 |
| $C_8H_{17}NH_2$ + $C_7H_{15}COOH$ | 2695 |
| Perfluoroalkylcarboxylate | 1823 |

*Selectivity ratio = $\frac{SiO_2 \text{ etching speed}}{Si \text{ etching speed}}$

What we claim is:

1. A surface treating composition for micro processing comprising a mixture of hydrofluoric acid, ammonium fluoride solution and water, and at least one compound selected from the group of surfactants consisting of an aliphatic carboxylic acid, a salt of aliphatic carboxylic acid, an aliphatic amine and an aliphatic alcohol represented by the formula $C_nH_{2n+1}OH$ where n is an integer of from 6 to 12.

2. A composition as defined in claim 1 wherein the surfactant is said aliphatic carboxylic acid which is a compound represented by the formula $C_nH_{n+1}COOH$ wherein n is an integer of from 5 to 11.

3. A composition as defined in claim 1 wherein the surfactant is said salt of aliphatic carboxylic acid which is a compound represented by the formula $C_nH_{n+1}COONH_3R$ wherein n is an integer of from 5 to 11, and R is hydrogen or alkyl having 5 to 10 carbon atoms.

4. A composition as defined in claim 1 wherein the surfactant is said aliphatic amine which is a compound represented by the formula $C_mH_{2m+1}NH_2$ wherein m is an integer of from 7 to 14.

5. A composition as defined in claim 1, which contains 0.1 to 10% by weight of hydrogen fluoride (HF) and 15 to 40% by weight of ammonium fluoride ($NH_4F$).

6. A composition as defined in claim 1 which contains the surfactant(s) in a combined amount of 10 to 10,000 ppm based on the weight of the composition.

* * * * *